(12) United States Patent
Fiedler et al.

(10) Patent No.: US 8,979,318 B2
(45) Date of Patent: Mar. 17, 2015

(54) LIGHT SOURCE WITH A LOW COLOR TEMPERATURE

(75) Inventors: Tim Fiedler, München (DE); Frank Jermann, München (DE); Jörg Strauβ, Regensburg (DE)

(73) Assignees: OSRAM Opto Semiconductors GmbH, Regensburg (DE); OSRAM Gesellschaft mit beschrankter Haftung, Munich (DE)

( * ) Notice: Subject to any disclaimer, the term of this patent is extended or adjusted under 35 U.S.C. 154(b) by 309 days.

(21) Appl. No.: 11/659,604

(22) PCT Filed: Jul. 15, 2005

(86) PCT No.: PCT/DE2005/001252
§ 371 (c)(1),
(2), (4) Date: Feb. 5, 2007

(87) PCT Pub. No.: WO2006/012833
PCT Pub. Date: Feb. 9, 2006

(65) Prior Publication Data
US 2007/0247829 A1    Oct. 25, 2007

(30) Foreign Application Priority Data
Aug. 5, 2004  (DE) .......................... 10 2004 038 199

(51) Int. Cl.
| F21V 9/00 | (2006.01) |
| H01L 33/50 | (2010.01) |
| C09K 11/77 | (2006.01) |
| H05B 33/14 | (2006.01) |

(52) U.S. Cl.
CPC .......... *H01L 33/502* (2013.01); *C09K 11/7734* (2013.01); *H05B 33/14* (2013.01)
USPC ...... 362/293; 362/263; 362/311.01; 362/326; 362/331; 362/332

(58) Field of Classification Search
USPC .................. 362/263, 293, 311, 326, 331, 332
See application file for complete search history.

(56) References Cited

U.S. PATENT DOCUMENTS

| 6,649,946 B2 * | 11/2003 | Bogner et al. ................ 257/233 |
| 2003/0006469 A1 | 1/2003 | Ellens et al. |
| 2003/0146690 A1 * | 8/2003 | Ellens et al. .................. 313/503 |
| 2004/0166320 A1 | 8/2004 | Kobusch |
| 2006/0028122 A1 * | 2/2006 | Wang et al. .................... 313/503 |

FOREIGN PATENT DOCUMENTS

| CN | 1337988 | 2/2002 |
| CN | 1432198 | 7/2003 |
| DE | 201 08 013 U1 | 8/2001 |
| DE | 100 26 435 A1 | 4/2002 |
| DE | 101 53 615 C1 | 7/2003 |
| WO | WO 01/24299 A2 | 4/2001 |
| WO | WO 01/40403 A | 6/2001 |
| WO | WO 01/50540 A1 | 7/2001 |
| WO | WO 02/052901 A2 | 7/2002 |
| WO | WO 02/052902 A2 | 7/2002 |

* cited by examiner

Primary Examiner — William Carter
(74) Attorney, Agent, or Firm — Cozen O'Connor

(57) ABSTRACT

LEDs having a low color temperature up to 5000 K, comprising a blue-emitting LED and, connected upstream thereof, two phosphors having a first phosphor from the class of the chlorosilicates and a second phosphor from the class of the nitridosilicates having the formula $(Ca,Sr)_2Si_5N_8:Eu$.

17 Claims, 11 Drawing Sheets

LIGHT SOURCE WITH A LOW COLOR TEMPERATURE

RELATED APPLICATIONS

This is a U.S. national stage of application No. PCT/DE2005/001252, filed on Jul. 15, 2005.

This patent application claims the priority of German patent application no. 10 2004 038 199.2 filed Aug. 5, 2004, the disclosure content of which is hereby incorporated by reference.

TECHNICAL FIELD

The invention is based on an LED having a low color temperature. This is understood to be a color temperature in the range from approximately 2000 to 6000 K, preferably up to 5000 K.

PRIOR ART

The range of warm-white color temperatures, i.e. below 3500 K, has until now been difficult to achieve using commercially available LEDs. Conventional phosphors impart a color temperature of more than 5000 K. Until now, attempts have therefore been made to provide low, in particular warm-white, color temperatures in a very complex manner by combining two or more LEDs, cf. for example WO 02/52901 and WO 02/52902.

Simple LEDs striving for warm-white luminous colors have until now been based on UV chips. Owing to the high difference in energy between the UV range and the short-wave visible range (blue) and the UV-related, radiation-dependent, more rapid aging, which is increased owing to the higher energy, of the housing and of the phosphor casting compound, these LEDs do not achieve either the life or the efficiency of neutral-white LEDs, as have been available to date on the basis of blue-emitting chips.

One alternative are RGB LEDs based on luminescence conversion LEDs using sulfide and thiogallate phosphors, cf., for example, WO 01/24229. However, it has been shown that the phosphors proposed therein do not meet requirements as regards long-term stability and efficiency when using high-power chips which reach a high operating temperature. The sulfides are chemically unstable to moisture, and the thiogallates which are proposed therein show pronounced temperature quenching. In addition, on contact with water, the known sulfide phosphors decompose so as to form toxic gases such as hydrogen sulfide.

Another solution which has been proven to make possible a long life and has a high efficiency with a very good color rendering index has until now not been known. The use of a mixture of the known YAG:Ce and a red phosphor such as, for example, $Sr_2Si_5N_8$:Eu leads only to maximum Ra values of 85 to 90, cf., for this purpose, WO 01/40403.

SUMMARY OF THE INVENTION

It is an object of the present invention to provide a light source, in particular an LED, having a warm-white or neutral-white luminous color, corresponding to a low color temperature of less than 6000 K whose Ra is as high as possible and reaches at least Ra=87, in particular more than Ra=90. A further object is to at the same time achieve as high an efficiency as possible with high stability.

Until now, this object has not been achieved to a satisfactory extent with high efficiency and stability, in particular for the range below 5000 K, although intensive efforts have been made in this direction. It is now proposed for a phosphor mixture comprising a special, highly efficient and stable green-emitting chlorosilicate and a red nitridosilicate phosphor known per se to be used, together with a blue-emitting primary radiation source.

A suitable light source, in particular as the primary radiation source, is a light-emitting diode based on InGaN or InGaAlP or a discharge lamp on a low-pressure or high-pressure basis or an electroluminescent lamp. This is intended to mean, in particular, fluorescent lamps or compact fluorescent lamps and mercury high-pressure lamps which have been color-corrected. In particular, significant advantages are achieved in the case of indium-based fillings for high-pressure discharge lamps and low-pressure discharge lamps.

In particular, this phosphor can be excited efficiently by a whole series of light sources, including LEDs (for example of the InGaN type), which emit UV or blue as primary radiation. Furthermore, all types of lamps, in particular Hg low-pressure and high-pressure lamps, as well as UV and VUV radiators between approximately 140 and 480 nm, for example excimer radiators. At 160 nm, the quantum efficiency is still approximately 50%. In particular, it can be used for indium-based discharge lamps, i.e. low-pressure or high-pressure discharge lamps, whose essential filling constituent is indium halide.

The LED is in the form of a white-emitting luminescence conversion LED, comprising a primary radiation source which is a chip which emits in the blue spectral range, in particular from 430 to 490 nm, preferably from 445 to 470 nm. This avoids the UV radiation which tends to shorten the life.

This phosphor is also particularly well suited to applications in luminescence conversion LEDs exhibiting full color suitability and luminescence conversion LEDs having colors which can be set as desired on the basis of an LED primarily emitting UV blue.

Connected upstream of this source is a layer of two phosphors which partially converts the radiation of the chip, it is the first phosphor comprising the class of chlorosilicates. It is in particular a calcium/magnesium chlorosilicate ($Ca_8Mg(SiO_4)_4Cl_2$) as a green to yellow-emitting phosphor. In this case, the chlorosilicate skeleton known per se is doped with europium (Eu) and possibly also with manganese (Mn). This phosphor is selected such that it emits green at a peak wavelength in the range from 500 to 520 nm, in particular from 505 to 515 nm. In principle, such phosphors are known from DE 100 26 435 and DE utility model 201 08 013. Other suitable chlorosilicates are described, for example, in CN-A 11 86 103.

The second phosphor is a nitridosilicate of the basic formula $(Ca,Sr)_2Si_5N_8$:Eu, a color temperature of at most 5000 K being achieved. However, higher color temperatures up to 6000 K can thus also be achieved. This takes place in particular by increasing the chlorosilicate/nitridosilicate mixing ratio, for example to be considerably higher than 1.5, in particular to be from 2.5 to 4, and reducing the total phosphor concentration in the resin or silicone. However, the use of nitridosilicates of the basic form $MSi_7N_{10}$ is also possible.

In particular, this combination of phosphors can be excited efficiently by a blue-emitting LED, primarily of the type InGaN.

Initially, this combination does not appear to be able to fulfill the object set if one considers each component by itself. The two phosphors, however, are matched precisely to one another such that they interact with one another in nonlinear fashion. In this case, the following consideration is relevant, in particular:

Using the stable green phosphor chlorosilicate which emits relatively short waves and has a peak wavelength around approximately 511 nm, it is possible to dispense with a dark-red phosphor, for example nitridosilicate having a high strontium content. The orange/red phosphor Ca nitridosilicate:Eu which is used according to an embodiment of the invention and contains at most low quantities of Sr is advantageously designed such that it absorbs at least the short-wave component of the green radiation of the phosphor used, and in particular it absorbs this component to a. greater extent than the longer-wave component. Such absorptions are normally prevented, if possible. In this case, however, it is used in an advantageous manner. As a result, the effective emission of the green phosphor shifts into a more favorable longer-wave spectral range (by up to approximately 15-20 nm, depending on the desired color temperature), and the color rendering index (Ra value) is surprisingly considerably higher than one would expect merely from the combination of the phosphor spectra, for example 87 at 2820 K and Ra =95 at 4095 K.

The second phosphor component is the nitridosilicate mentioned initially of the $(Sr_aCa_{1-a})_2Si_5N_8$:Eu type having a suitable composition. In this case, a=0 to 0.15 is preferred. Particularly preferred is $0 \leq a \leq 0.1$.

It is possible to provide efficient, in particular also warm-white LEDs having a color rendering index Ra of up to 95 using these two phosphors, whose typical quantum efficiency is markedly over 80% and which both absorb very well in the range of short-wave blue radiation, primarily also at from 450 to 455 nm, where the most powerful chips are available. A typical Ra value is 88 to 95, depending on the desired optimization. Other phosphors can of course also be added to improve color rendering, for example YAG:Ce, $(Lu,Y)_3(Al,Ga)_5O_{12}$:Ce, $(Sr,Ba,Ca)Si_2O_2N_2$:Eu or else $(Sr,Ba,Ca)_2SiO_4$:Eu. These phosphors emit in the yellow/green range with peak emission at from 530 to 570 nm.

A further particular advantage is the fact that it is possible by means of selective self-absorption to use two types of phosphor which show particularly high stability in an LED but do not appear on first inspection to be capable of being combined with one another in order to achieve this aim. Only by matching the two phosphors carefully in a targeted manner has it proven possible to achieve the desired effect of producing color rendering values of above 90. In this case, it is particularly necessary to incorporate as little Sr as possible up to no Sr at all in the nitridosilicate since by far the most stable preparation is pure $CaSi_5N_8$:Eu. Other compounds which crystallize in the $CaSi_5N_8$:Eu phase are also suitable.

Mixing ratios which can be used are generally between 1:9 and 9:1, depending on the desired result, i.e. in particular color temperature and color locus.

In detail, an LED having a low color temperature is proposed in the form of a white-emitting luminescence conversion LED having a primary radiation source which is a chip which emits in the blue spectral range and, connected upstream thereof, a layer of two phosphors which both partially convert the radiation of the chip, the first phosphor originating from the class of the green-emitting chlorosilicates, doped with europium and possibly also manganese, resulting in the empirical formula $Ca_{8-x-y}Eu_xMn_yMg(SiO_4)_4Cl_2$ where $x \geq 0.005$ and $0 \leq y \leq 1$, and the second phosphor being an orange/red nitridosilicate of the formula $(Ca_{1-a}Sr_a)_2Si_5N_8$:Eu, where $0 \leq a \leq 0.15$, the components being mixed such that a color temperature of at most 6000 K, in particular at most 5000 K, is achieved. In particular, x is selected between $0.02 \leq x \leq 1.2$, for example x=0.05 to 0.5.

The addition of Mn makes it possible to establish the average emission wavelength. Only some of the Eu, in particular at most 5 to 30 mol %, should preferably be replaced by Mn.

The chip is preferably an InGaN chip since they have a high efficiency.

It is for the first time possible to achieve a color temperature down to 2000 K, in particular from 2700 to 3300 K, using such an LED design with high stability. Despite the low color temperature, high color rendering indices in the range from 87 to 95 can be achieved, to be precise with stable, continuous operation. An essential requirement for the use of white LEDs in general lighting is thus satisfied for the first time.

The emission of the chip is preferably such that it has a peak wavelength in the range from 445 to 465 nm, in particular from 450 to 455 nm. The highest efficiencies of the primary radiation can thus be achieved.

A chlorosilicate which has an emission in the range from 500 to 520 nm as the peak wavelength is particularly suitable. This original property acts as an effective emission in the LED which is typically shifted by 5 to 20 nm towards longer wavelengths. In addition, the width of the emission is altered. A typical original FWHM (full width at half maximum) is 60 nm, which is typically extended to 70 to 80 nm in the LED.

Particularly suitable is a nitridosilicate whose emission has a peak wavelength in the range from 600 to 620 nm, in particular from 605 to 615 nm.

A particularly well suited chlorosilicate has the empirical formula $Ca_{8-x-y}Eu_xMn_yMg(SiO_4)_4Cl_2$, where x is between x=0.1 and x=1 and where y is between y=0 and y=0.3, in each case including the limit values.

The best color rendering values can be achieved if the following guideline is complied with, namely that the absorption behavior of the nitridosilicate within the original FWHM of the emission of the chlorosilicate shows a gradient, the value at the short-wave edge being higher than the corresponding value at the long-wave edge, for example by at least a factor of two to three.

The higher this factor and the wider, in the process, the FWHM of the concomitantly used chlorosilicate, the more effective is the shift in the emission of the chlorosilicate, which may be up to 30 nm, based on the peak wavelength.

The temperature dependence of the luminescence is significantly less than in a few systems which have been proposed to date; both types of phosphors are, for example, chemically markedly more stable than their sulfide alternatives known to date (SrS:Eu and thiogallates). The nitride-based phosphors and their possible decomposition products are largely nontoxic, which is significant in terms of environmental protection.

Standard methods can be used for use in the LED. In particular, the following possible implementations result.

Firstly, the dispersion of the phosphor into the LED casting compound, for example a silicone or epoxy resin, and subsequent application by means of, for example, casting, printing, spraying or the like. Secondly, introduction of the phosphor into a so-called molding compound and subsequent transfer molding method. Thirdly, near-chip conversion methods, i.e. application of the phosphors or a mixture thereof to the wafer processing level, once the chips have been separated and once they have been mounted in the LED housing. For this purpose, reference is made in particular to DE 101 53 615 and WO 01/50540.

The invention further relates to an illumination system having LEDs as described above, the illumination system also containing electronic components. These electronic components provide, for example, the dimming function. A further task of the electronics is that of driving individual LEDs or else groups of LEDs. These functions can be realized by previously known electronic elements.

DESCRIPTION OF THE DRAWINGS

Figure 1:
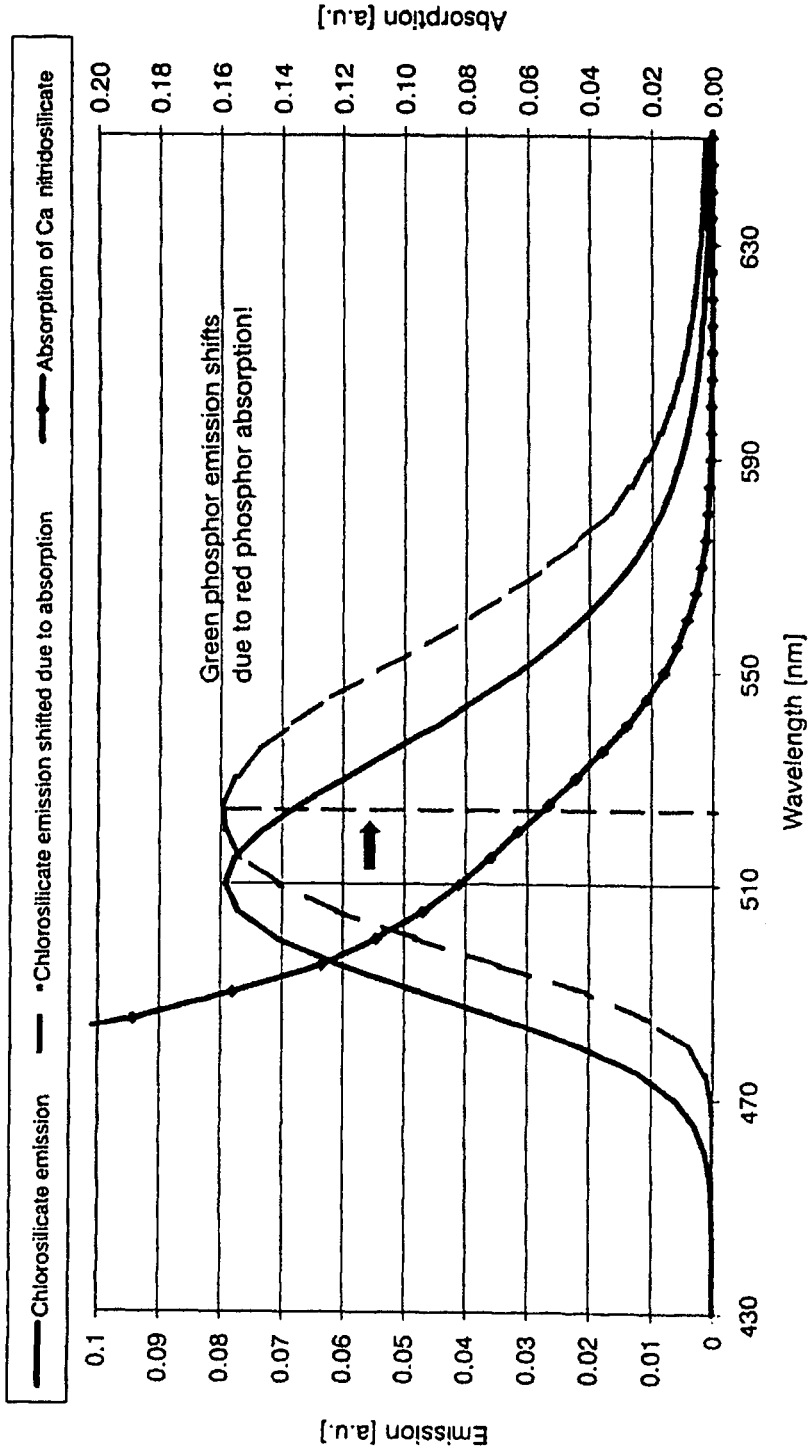
FIG. 1 shows the mechanism on which the invention is based.

A specific example of the principle according to the invention is shown in FIG. 1. It shows the emission of the phosphor $Ca_{8-x}Eu_xMg(SiO_4)_4Cl_2$, where x=0.2, in which the Eu content is 2.5 mol % of the lattice sites occupied by Ca. The emission maximum of the pure phosphor is 511 nm. The excitation took place at 460 nm. The FWHM is 76 nm. At the same time, a nitridosilicate of the $(Ca_{1-b}Eu_b)_2Si_5N_8$ type, where b=0.02, is used in the LED, the emission of said nitridosilicate being in the region of 600 nm. However, this is not shown in FIG. 1. Rather, the characteristic of the absorption of the nitridosilicate which has a severe gradient in the region of the FWHM of the chlorosilicate is decisive. An important factor here is the characteristic between the short-wave edge of the FWHM ($\lambda 1$) and the long-wave edge of the FWHM ($\lambda 2$), in each case based on the chlorosilicate. In this case, the absorption increases to a considerable extent towards longer wavelengths. Owing to this self-absorption, the action of the chlorosilicate in the LED is shifted towards the longer wavelengths, cf. the dashed line, whose maximum is now shifted approximately 15 nm. An effective shift is provided if, as shown, the absorption value of the nitridosilicate at the short-wave edge is greater than the corresponding value at the long-wave edge by a factor of two to three, preferably even higher. Both emission and absorption are specified in arbitrary units in FIG. 1.

Figure 2:
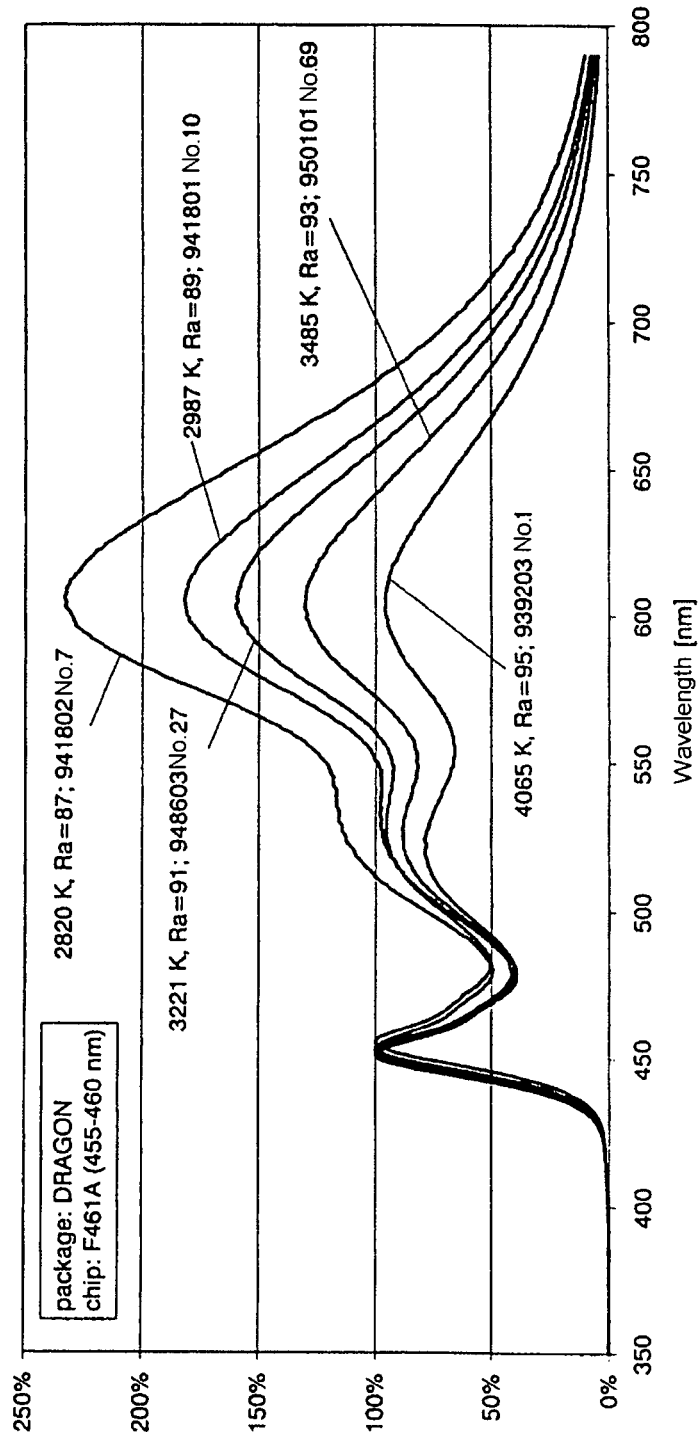
FIG. 2 shows the emission spectrum of various embodiments of LEDs according to the invention.

FIG. 2 shows the emission spectrum of various LEDs which are designed for different color temperatures. The range of color temperatures reaches from approximately 2800 K to more than 4000 K. In detail, the following combinations were used for the five color temperatures:

| Color temperature | Chlorosilicate content | Nitridosilicate content | Phosphor concentration [wt. %] | $R_a$ |
|---|---|---|---|---|
| 2820 K | 1.5 | 1 | 14 | 87 |
| 2987 K | 1.5 | 1 | 13 | 89 |
| 3221 K | 1.7 | 1 | 13 | 91 |
| 3485 K | 1.7 | 1 | 13 | 93 |
| 4065 K | 2 | 1 | 11 | 95 |

Figure 3:
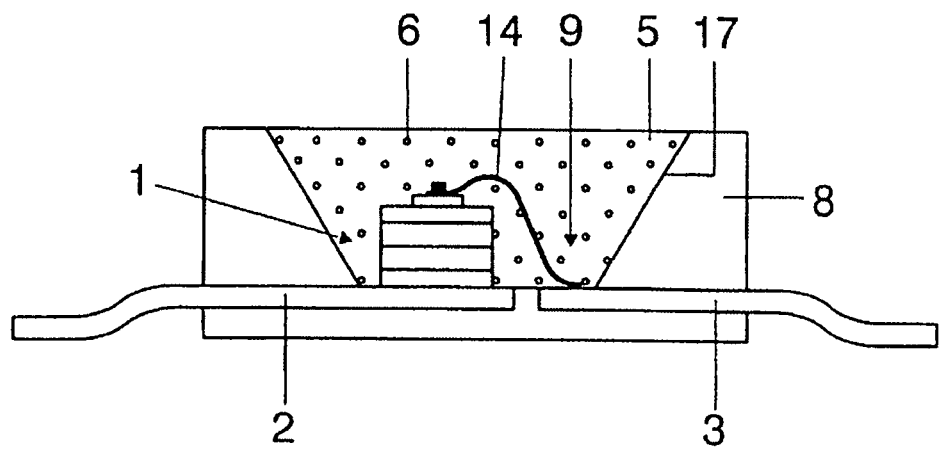
FIG. 3 shows the design of an LED.

The design of a light source for white light is shown explicitly in FIG. 3. The light source is a semiconductor component having a chip 1 of the InGaN type having a peak emission wavelength of from 440 to 470 nm, for example 455 nm, which is embedded in an opaque basic housing 8 in the region of a recess 9. The chip 1 is connected to a first connection 3 via a bonding wire 14 and directly to a second electrical connection 2. The recess 9 is filled with a casting compound 5 which contains as the main constituents a resin (for example silicone) (80 to 90 wt. %) and phosphor pigments 6 from a mixture of two phosphors (less than 20 wt. %). A first phosphor is the chlorosilicate which is proposed as the first exemplary embodiment having 2.5% Eu, and the second phosphor is an orange/red-emitting phosphor, in this case in particular $Ca_2Si_5N_8$:Eu(2%). The recess 9 has a wall 17 which acts as a reflector for the primary and secondary radiation from the chip 1 or the pigments 6. The combination of the blue primary and green or red secondary radiation is mixed to give warm white having a high Ra of 87 to 95 and color temperatures as specified in the table above.

In general, the nitridosilicate $M_aSi_yN_z$:Eu contains Ca as the permanent component and Sr as an admixture at a content of 0 to 15 mol %. In other words, the preferred nitridosilicate is characterized by the formula $(Sr_xCa_{1-x})_aSi_yN_z$, where x=0 to 0.15, y=5 and z=8 preferably being selected. In general, the efficiency and the color rendering index Ra are adapted by means of the degree of doping with Eu; a value for Eu is preferably from 1 to 4 mol % of M. It has been shown that a small addition of Sr (<10%) and limiting of the Eu content (<10%) is recommended in order to achieve high color rendering indices. For Ra>90, x can therefore be selected up to a maximum of 0.2 (preferably x up to 0.1), and at the same time Eu can preferably be used in the range from 0.5 to 15 mol % of M (preferably 1 to 4 mol %).

Figure 4:
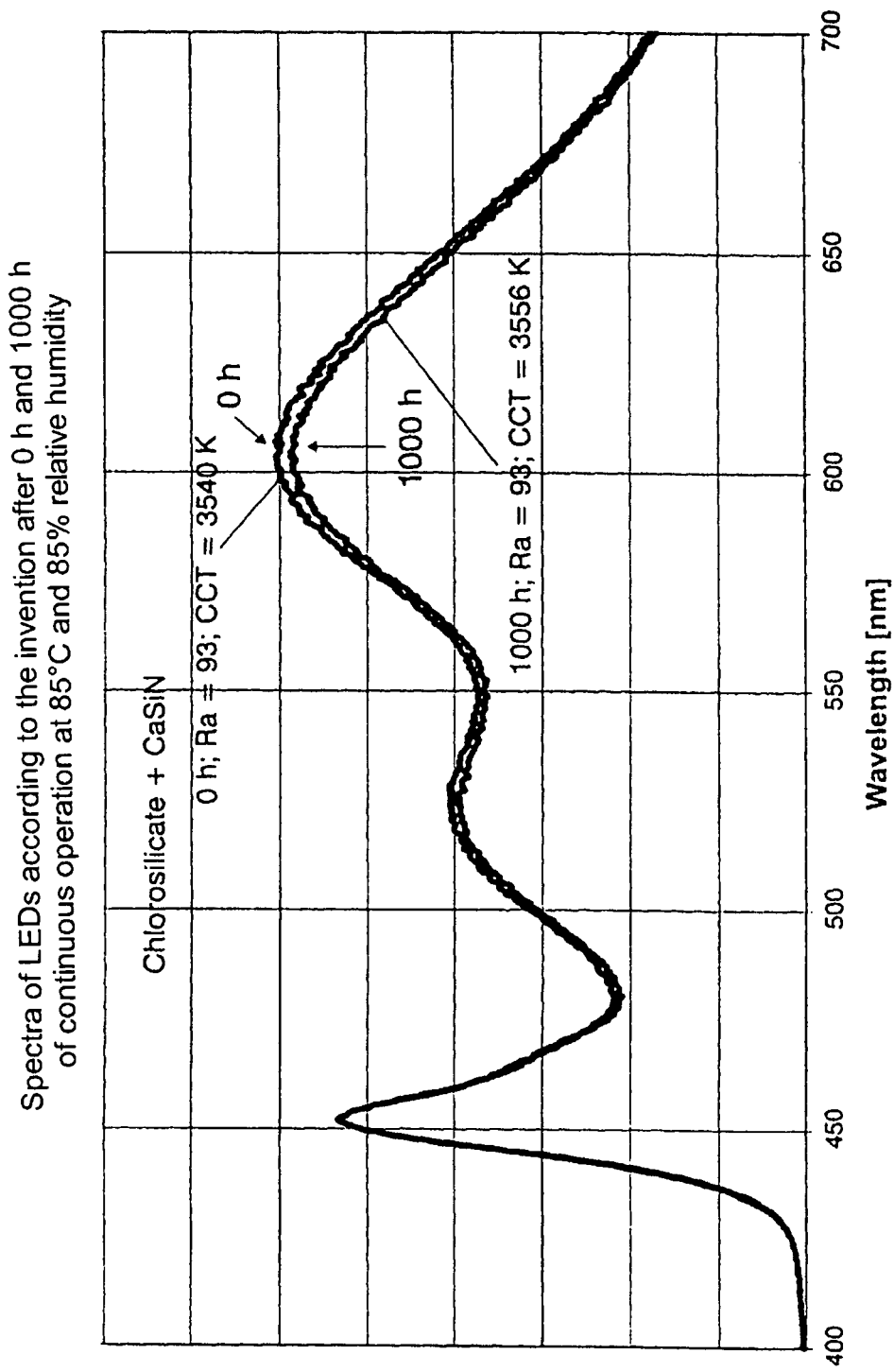
FIG. 4 shows the emission spectrum of an LED as a function of the operating time.

The emission spectrum of a typical exemplary embodiment as a function of the life is shown in FIG. 4. It shows the intensity in arbitrary units as a function of the wavelength (in nm). The peaks of the primary radiation at 460 nm, of the chlorosilicate at approximately 530 nm and of the nitridosilicate at approximately 610 nm can clearly be seen. A high constancy is shown after 1000 hours. This applies both to the Ra (constant 93) and to the color temperature (3550 K+/−10 K).

Figure 5:
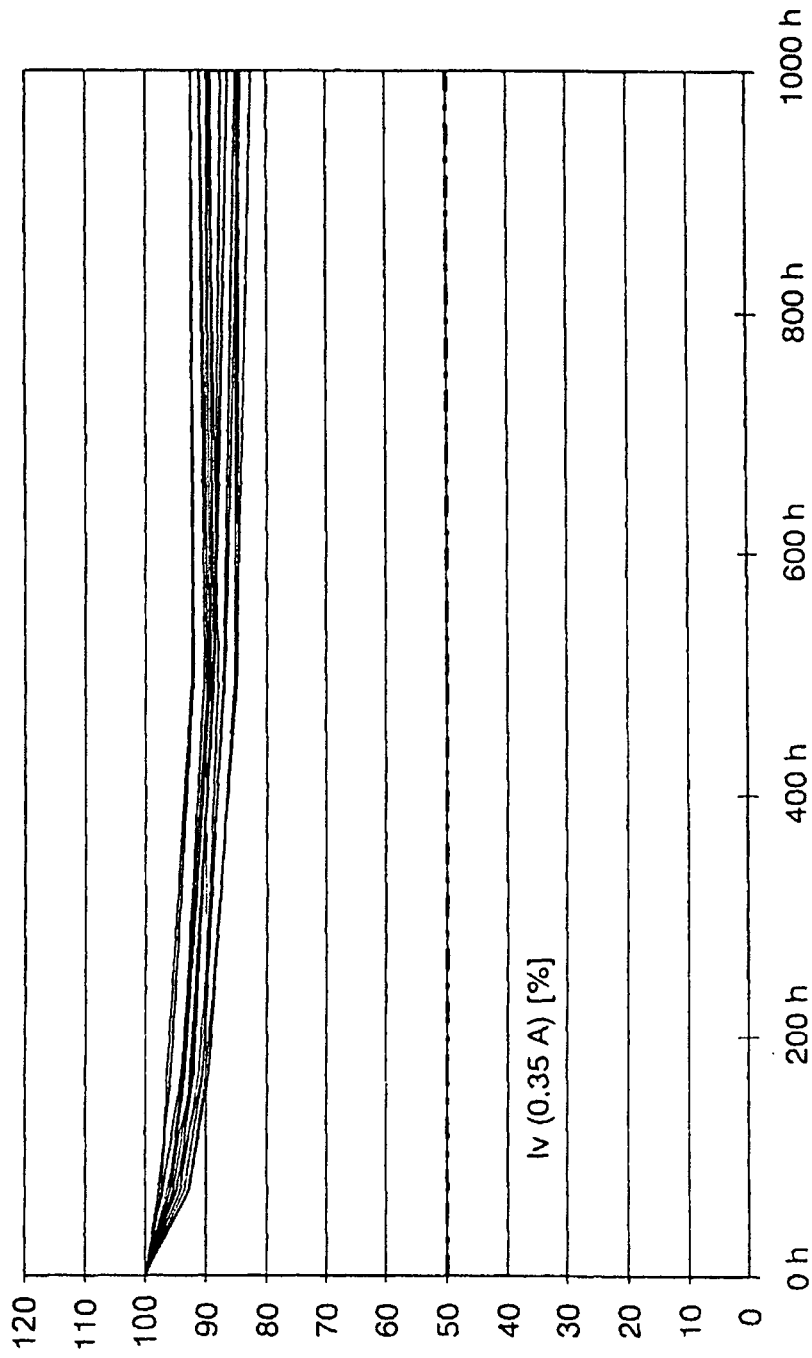
FIG. 5 shows the reduction in brightness of an LED as a function of the operating time.

FIG. 5 shows the reduction in brightness of various LEDs according to the invention from table 1 over 1000 hours operating time at 85° C. and 85% relative humidity. The reduction is of the order of magnitude of a few percent and is thus considerably better than in the case of previously known white LEDs having similarly high color rendering.

Figure 6:
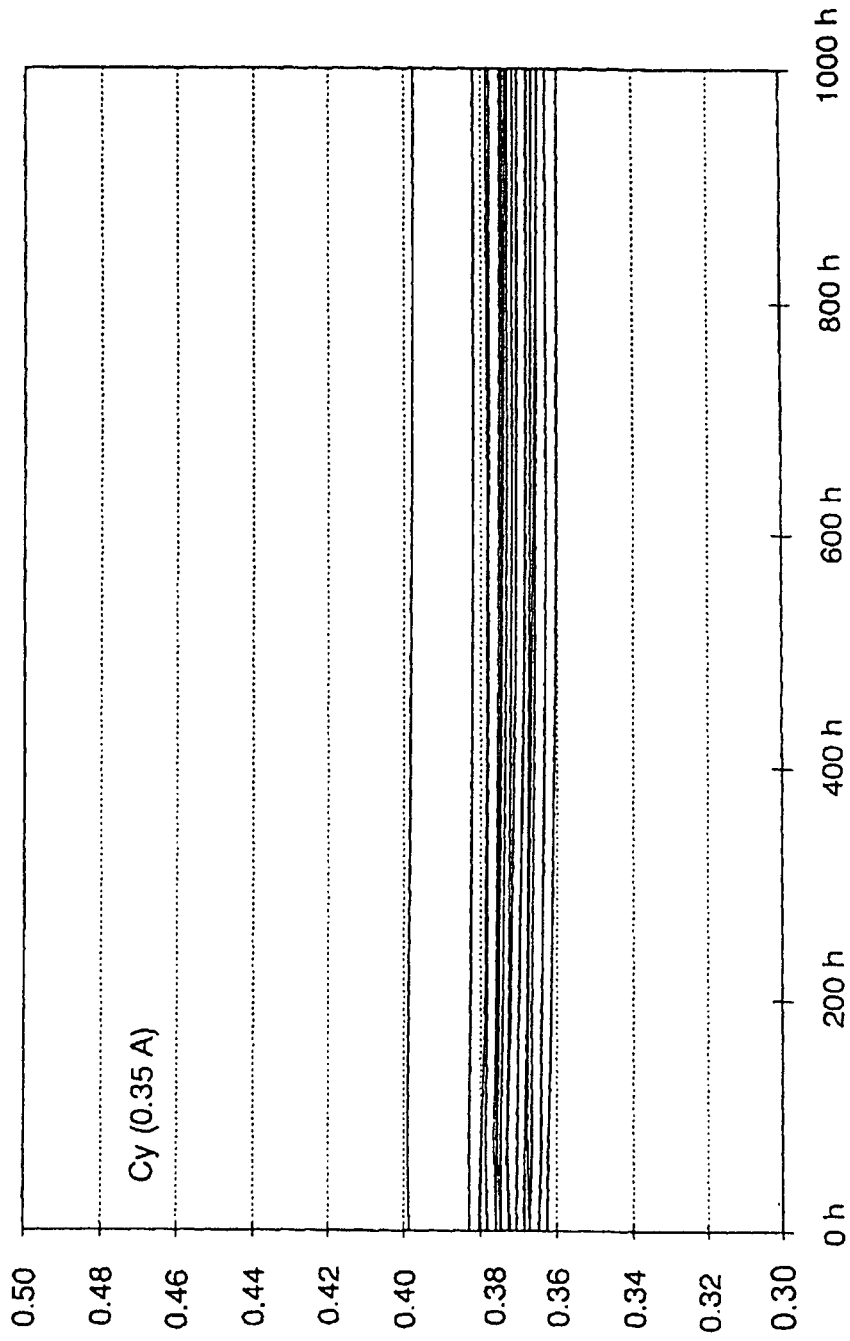
FIG. 6 shows the shift in the y coordinate of an LED as a function of the operating time.

FIG. 6 shows the y color coordinate of various LEDs according to the invention from table 1 over 1000 hours operating time at 85° C. and 85% relative humidity. Virtually no drift can be seen.

Figure 7:
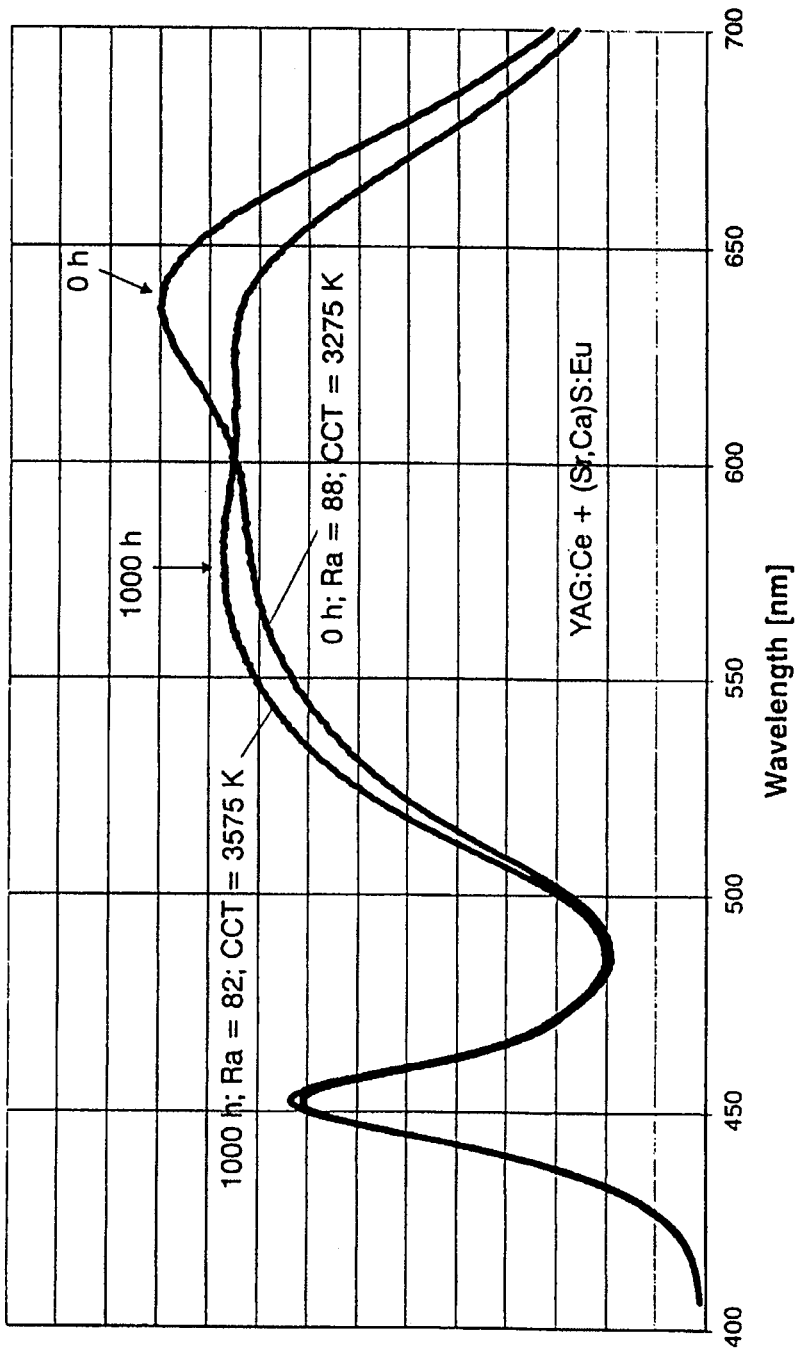
FIG. 7 shows the emission spectrum of an LED in accordance with the prior art as a function of the operating time.
Figure 8:
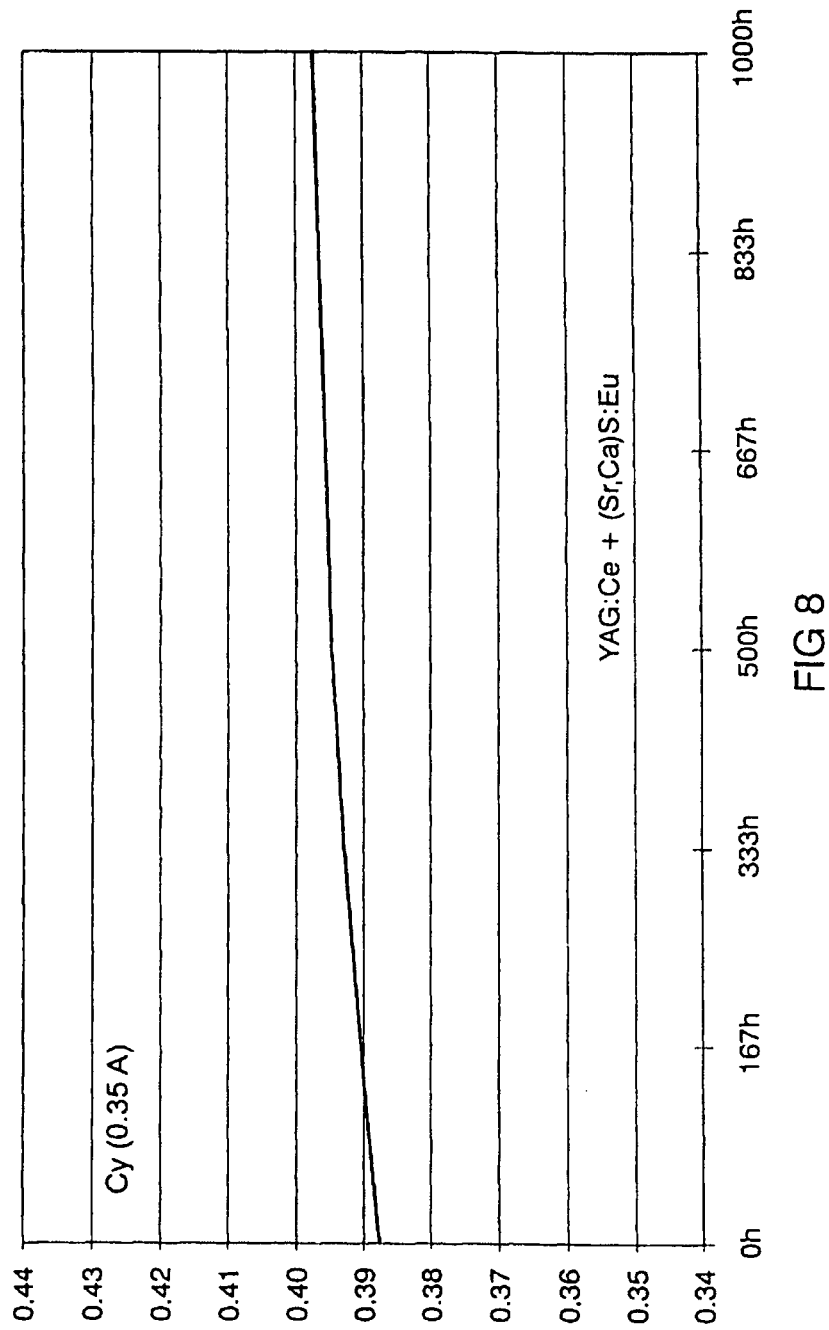
FIG. 8 shows the shift in the y coordinate of an LED in accordance with the prior art as a function of the operating time.

In comparison therewith, a previously known warm-white LED having high color rendering as shown in FIG. 7 which comprises a blue primary source and the phosphors YAG:Ce combined with dark-red sulfide phosphor (Sr, Ca)S:Eu, shows a considerable amount of color drift after 1000 hours. This results in its color temperature being altered from 3275 to 3575 K. Correspondingly, the drift in the y color coordinate over 1000 hours operating time at 85° C. and 85% relative humidity is also considerable, cf. FIG. 8.

Figure 9:
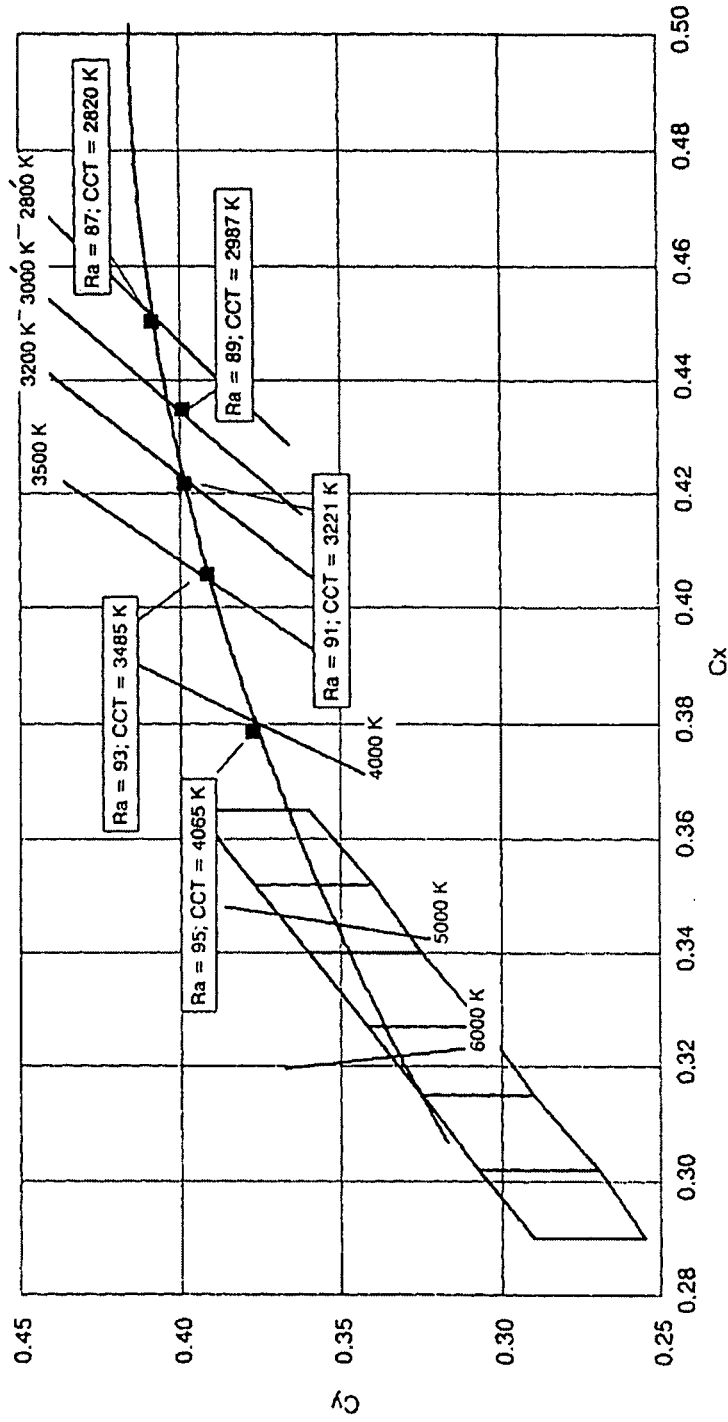
FIG. 9 shows the position of the color locus of various white LEDs.

FIG. 9 shows the broad range of color temperatures which can be achieved with the LEDs according to the invention, as are described in table 1.

Figure 10:
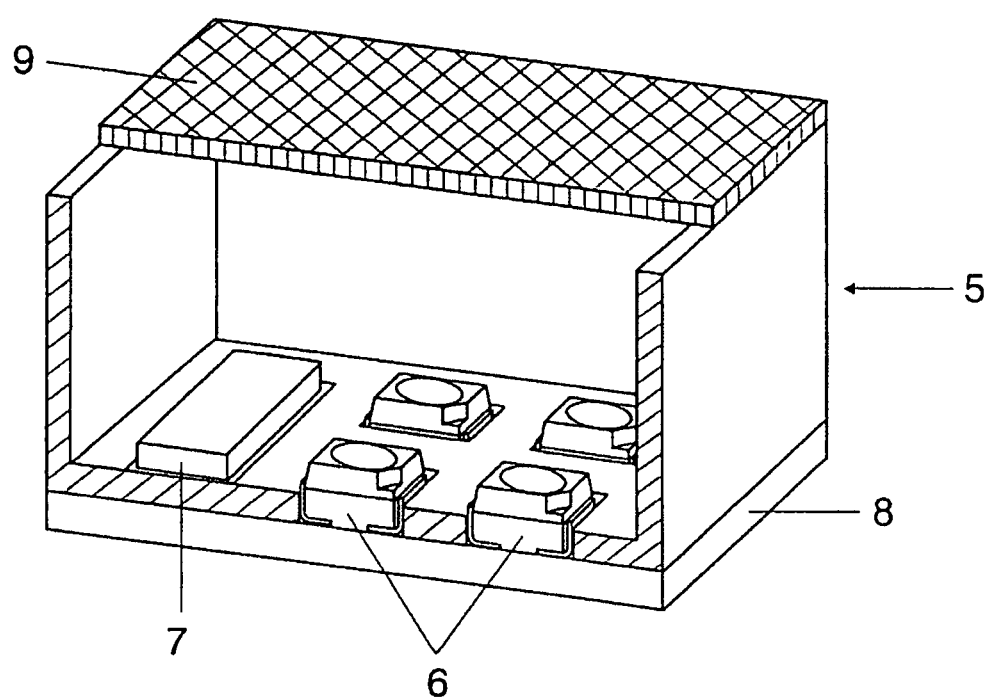
FIG. 10 shows an illumination system based on warm-white LEDs.

FIG. 10 shows an illumination system 5 in which, in addition to LEDs 6 according to the invention, the control electronics 7 are also accommodated in a housing 8. 9 denotes a cover.

Figure 11:
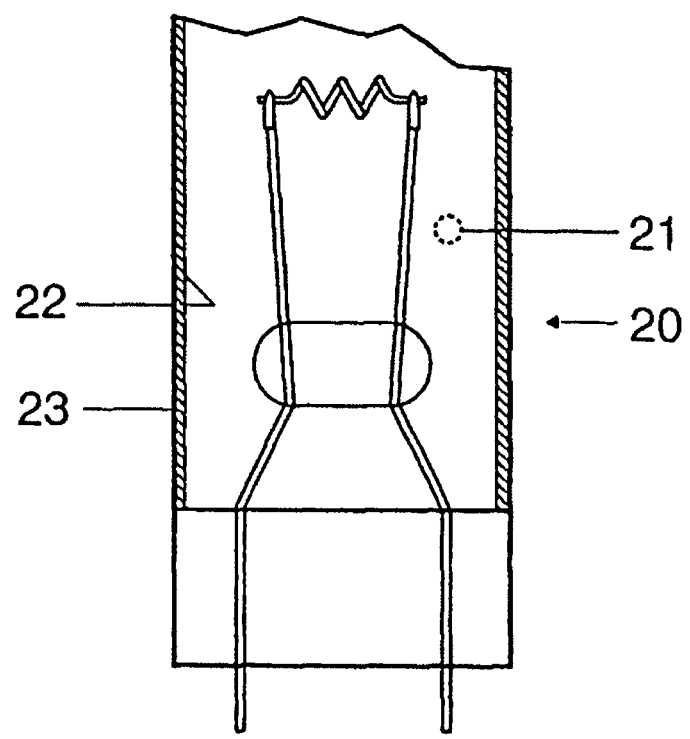
FIG. 11 shows a low-pressure lamp having an indium filling using suitable phosphors.

FIG. 11 shows a low-pressure discharge lamp 20 having a mercury-free gas filling 21 (schematic) which contains an indium compound and a buffer gas as in WO 02/10374, a layer 22 made from a phosphor mixture being applied to the inside of the bulb 23. A first phosphor is the chlorosilicate proposed as the first exemplary embodiment having 2.5% Eu, and the second phosphor is an orange/red-emitting phosphor, in this case in particular $Ca_2Si_5N_8$:Eu(2%). The particular advantage of this arrangement is the fact that the phosphor mixture is ideally matched to the indium radiation, since this indium radiation has substantial components both in the UV and in the blue spectral range which are both absorbed equally well by this mixture, which makes them superior to the previously known phosphors in this use. These known phosphors absorb notably either only the UV radiation or the blue radiation of the indium, with the result that the indium lamp according to the invention has a much higher efficiency. This statement also applies to an indium lamp on a high-pressure basis, as is known per se from U.S. Pat. No. 4,810,938.

The invention claimed is:

1. A light source having a low color temperature, comprising:
   a primary radiation source which emits in a blue spectral range; and
   a layer of two phosphors connected upstream of the primary radiation source, both phosphors partially converting primary radiation from the primary radiation source, wherein a first phosphor of the two phosphors originates from a class of green-emitting chlorosilicates, doped with europium, resulting in an empirical formula $Ca_{8-x-y}Eu_xMn_yMg(SiO_4)_4Cl_2$, where $x \geq 0.005$ and $0 \leq y \leq 1$, and wherein a second phosphor of the two phosphors is an orange/red nitridosilicate of a formula $(Ca_{1-a}Sr_a)_2Si_5N_8$:Eu, where $0 \leq a \leq 0.15$, components of the formulas being mixed such that a color temperature of at most about 3550 K is achieved;
   wherein the first phosphor has a peak emission in a range from 500 nm to 520 nm, and the second phosphor absorbs at least a short wavelength component of radiation emitted by the first phosphor and absorbs this component to a greater extent than a longer wavelength component of the radiation emitted by the first phosphor, thereby increasing an effective peak emission of the first phosphor by more than 5 nm.

2. The light source as claimed in claim 1, wherein the Eu content of the chlorosilicate is a maximum of $x = 1.2$ (15 mol %).

3. The light source as claimed in claim 1, wherein the Eu content of the nitridosilicate when using the preparation $(Ca_{1-a-b}Sr_aEu_b)_2Si_5N_8$ is between $b = 0.005$ and $0.2$.

4. The light source as claimed in claim 2, in the chlorosilicate, some of Eu is replaced by Mn.

5. The light source as claimed in claim 1, wherein the light source has a color temperature of at least 2000 K.

6. The light source as claimed in claim 1, wherein an emission of the light source has a peak wavelength in a range from 445 to 475 nm.

7. The light source as claimed in claim 1, wherein an emission of the nitridosilicate has a peak wavelength in a range from 590 to 620 nm.

8. The light source as claimed in claim 1, wherein an efficiency and color rendering index of at least 87 is achieved.

9. The light source as claimed in claim 1, wherein the chlorosilicate is a chlorosilicate having an empirical formula $Ca_{8-x-y}Eu_xMn_yMg(SiO_4)_4Cl_2$, where x is between $x = 0.05$ and $x = 1.9$, and where y is between $y = 0$ and $y = 1.0$, in each case including limit values.

10. The light source as claimed in claim 1, wherein the second phosphor absorbs the radiation emitted by the first phosphor in a region of a full width at half maximum (FWHM) of the radiation emitted by the first phosphor.

11. The light source as claimed in claim 10, wherein absorption behavior of the nitridosilicate within the FWHM of the emission of the chlorosilicate shows a gradient, a value of an effective absorption at a short-wave edge being at least a factor of two, preferably at least a factor of three, higher than a corresponding value at a long-wave edge.

12. The light source as claimed in claim 11, wherein absorption at the short-wave edge is so high that the absorption at the short-wave edge leads to a shift in the effective emission of the chlorosilicate which is from 5 to 20 nm, based on the peak wavelength.

13. The light source as claimed in claim 1, wherein the nitridosilicate is an orange/red nitridosilicate of a formula $Ca_2Si_5N_8$:Eu.

14. The light source as claimed in claim 1, wherein, in the nitridosilicate, the Eu content at cation (Ca,Sr) is between 0.5 and 15 mol %, limit values included.

15. The light source as claimed in claim 1, wherein the light source is a white-emitting luminescence conversion LED.

16. The light source as claimed in claim 1, wherein the light source is an indium-based discharge lamp.

17. The light source as claimed in claim 1, wherein the class of the green-emitting chlorosilicates are doped with manganese.

* * * * *